(12) United States Patent
Franken et al.

(10) Patent No.: US 7,056,388 B2
(45) Date of Patent: Jun. 6, 2006

(54) REACTION CHAMBER WITH AT LEAST ONE HF FEEDTHROUGH

(75) Inventors: Walter Franken, Eschweiler (DE); Gerd Strauch, Aachen (DE); Johannes Kappeler, Wurselen (DE); Holger Jurgensen, Aachen (DE)

(73) Assignee: Aixtron AG (DE)

( * ) Notice: Subject to any disclaimer, the term of this patent is extended or adjusted under 35 U.S.C. 154(b) by 153 days.

(21) Appl. No.: 10/269,157

(22) Filed: Oct. 11, 2002

(65) Prior Publication Data

US 2003/0111015 A1    Jun. 19, 2003

Related U.S. Application Data

(63) Continuation of application No. PCT/DE01/01450, filed on Apr. 12, 2001.

(51) Int. Cl.
*C23C 16/00* (2006.01)

(52) U.S. Cl. ............... 118/715; 118/723 R; 156/345.1; 156/345.44; 174/262

(58) Field of Classification Search ............... 118/715, 118/728, 729, 730, 723 R, 723 VE–723 IR; 156/345.1–345.55; 174/8, 17.08, 18, 50.5, 174/50.52, 151, 152 R, 152 A, 152 E, 152 S, 174/152 G, 152 GM, 153 R, 153 A, 153 G, 174/154, 155, 156, 157, 262; 439/253, 262, 439/271, 527, 544, 559, 660, 661, 933, 934

See application file for complete search history.

(56) References Cited

U.S. PATENT DOCUMENTS

| 3,435,128 A | * | 3/1969 | Dorwald ............... 174/151 |
| 5,855,681 A | * | 1/1999 | Maydan et al. ......... 118/719 |
| 6,203,620 B1 | * | 3/2001 | Moslehi ............... 118/723 R |

FOREIGN PATENT DOCUMENTS

| EP | 0 109 808 A2 | | 5/1984 |
| FR | 852026 A | * | 1/1940 |
| WO | WO 97/42648 | | 11/1997 |
| WO | WO 00/22646 | | 4/2000 |

* cited by examiner

*Primary Examiner*—Luz Alejandro-Mulero
(74) *Attorney, Agent, or Firm*—St. Onge Steward Johnston & Reens LLC

(57) ABSTRACT

A reaction chamber for carrying out substrate coating methods is disclosed, having at least one opening in at least one outer wall in which an HF feedthrough is inserted in a pressure or vacuum tight manner. The reaction chamber is further characterized by a combination of the following features: a support plate with coolant channels, and at least one opening for an HF line; an HF line collar in the zone disposed in the reaction chamber, a first seal on the collar; a first disc from an insulating material between a second seal on the support plate and the first seal on the collar; a thread in the zone outside the reaction chamber, a screw element being screwed onto the thread, all configured to prevent an electrical contact between the HF line and the support plate being established or an arc-over between the HF line and the support plate occurring.

9 Claims, 1 Drawing Sheet

REACTION CHAMBER WITH AT LEAST ONE HF FEEDTHROUGH

FIELD OF THE INVENTION

This application is a continuation of pending International Application No. PCT/DE01/01450 filed Apr. 12, 2001, designating the United States and claiming priority from pending German Application No. 100 18 127 filed Apr. 12, 2000.

BACKGROUND OF THE INVENTION

This invention relates to a reaction chamber for carrying out substrate coating methods, such as chemical vapor deposition (CVD) methods, in which at least one opening comprises an HF (high frequent) feedthrough, such as an RF (radio frequency) feedthrough, inserted in a pressure- and vacuum-tight manner in at least one outside wall.

Reaction chambers are used for producing III-V or II-VI semiconductor layers, superconductors, or other layers on any desired substrate, such as silicon or SiC, e.g. by means of CVD methods. Various reaction chambers and uses thereof are known in the art including, but not limited to known reaction chambers, as disclosed by the patent literature and/or manufactured by Aixtron AG, Aachen, Del.

In many applications, inductive heaters or resistant heaters are used for heating the substrates and/or other elements of the reaction chamber. For feeding the induction coils or other electrical elements disposed in the reaction chamber for heaters, sensors or control devices, it is necessary to provide electrical feedthroughs and especially HF or RF (radio frequency) feethroughs.

BACKGROUND OF THE INVENTION

The feedthroughs, such as the HF or RF feedthroughs, are usually inserted in openings which are provided in the outside wall of the reaction chamber. It goes without saying that it is necessary for the feedthrough to be inserted in the respective opening in such a way that the reaction chamber remains sealed in a vacuum- and pressure-tight manner from the space outside.

The patent literature discloses a wide variety of embodiments of vacuum- and pressure-tight HF and RF feedthroughs. Furthermore, a wide variety of feedthroughs for vacuum recipients or the like are offered for sale by the relevant manufacturers.

However, with regard to the requirements stated below, as they arise specifically in the case of reaction chambers for the applications stated at the beginning, the known feedthroughs are not optimal, or make a compromise with respect to the overall set of requirements which follow:

1. HF feedthroughs should be insensitive to impact and shock, and especially not be made to leak by impact or shock, as may occur when working in reaction chambers.

2. HF feedthroughs should allow themselves to be cooled with water, especially whenever they are intended to conduct high levels of electrical energy into the interior space of the reaction chamber, without arc-overs to the chamber wall or other parts of the reaction chamber occurring.

3. HF feedthroughs should be easily exchangeable, allowing if need be defective parts to be easily replaced.

4. HF feedthroughs should also be suitable for being manufactured at low cost.

SUMMARY OF THE INVENTION

One objective of the present invention is to provide a reaction chamber with at least one electrical feedthrough such as an HF feedthrough, manufactured at low cost and easily installed. Another object of the present invention is to provide a reaction chamber having a feedthrough capable of withstanding impact or shock without being damaged. Another object of the present invention is to provide a reaction chamber which is water tight. Another object of the present invention is to provide a reaction chamber having a feedthrough with replaceable parts.

The objectives of the present invention are met by providing a reaction chamber as described in claim 1 below. Developments of the invention are the subject of claims 2 and the claims which follow.

The invention is distinguished by the combination of the following features:

a support plate inserted in a sealing manner into every opening, the support plate comprising at least one opening for an HF line, every HF line having at its region disposed in the reaction chamber a collar on which a first seal is provided, a first disk of an insulating material is inserted between a second seal on the support plate and the first seal on the collar, at the region of each HF line disposed outside the reaction chamber there is provided a thread onto which a screw element is screwed in such a way that it holds the collar of the HF line in a sealing manner against the insulating disk via the first seal and said disk against the support plate via the second seal, without an electrical contact between the HF line and the support plate being established or an arc-over between the HF line and the support plate occurring.

The feedthrough used in the case of the reaction chambers according to the invention comprises two "main elements", that is the support plate and the at least one HF line inserted into the support plate. The two parts are insulated from each other and can consist of a metal, so that they are not fragile. The HF line is screwed to the support plate in order to form a connection. The screwed connection, may comprise a union nut, and be designed in such a way that no major forces are exerted on fragile materials, such as elements of insulating material, even if impact or shock act on the HF line and/or the support plate. Shock resistance is achieved by the insulation between the HF line and the support plate being established by an insulating disk, which may comprise quartz or a ceramic material. A disk of this type is comparatively insensitive to ruptures etc. Should damage nevertheless occur to the insulating disk and/or seals, which may be O-rings, these parts can be easily exchanged after releasing the connections, and especially the screwed connection between the HF line and the support plate.

The screw element may comprise an insulating material. Preferably however, the screw element is made of metal, such as steel or stainless steel, when a second disk of an insulating material, preferably comprising quartz or a ceramic material, is inserted between the screw element and the support plate.

To prevent electrical contact or arc-overs between the HF line and the support plate, consisting for example of stainless steel, it is further preferred that a sleeve of insulating material is inserted between the first disk and the second disk or the screw element. This sleeve, which may under certain circumstances be subjected to forces but does not contribute to the sealing effect, preferably consists of an insulating plastic, and especially polytetrafluoroethylene (TEFLON).

In particular whenever high levels of electrical energy are to be transferred into the reaction chamber, it is advantageous that the support plate is water-cooled. For this purpose, channels through which water flows may be provided in the support plate. In this case, it is particularly advantageous if every HF line is surrounded by a channel through which water flows.

In the case of a preferred configuration of the invention, the collar is a component part of a sleeve which is mounted in a sealing manner on the HF line, and at the other end of which the thread is provided.

With regard to the electrical and thermal conductivity, it is further preferred that the HF line consists of copper. The collar may then consist of a (different) metallic material such as stainless steel and be soldered onto the HF line.

To establish a sealed connection between the outside wall of the reaction chamber and the support plate, it is further of advantage that the support plate has an external seal, and is screwed to the wall of the reaction chamber in the region inside the seal.

In the case of a preferred exemplary embodiment of the invention, at least two lines, and especially HF lines, are provided in the (every) support plate as the leads for a coil of an inductive heater.

BRIEF DESCRIPTION OF THE DRAWING

The invention is described below by way of example, without restricting the general idea of the invention, on the basis of an exemplary embodiment with reference to the drawing. In the drawing.

DETAILED DESCRIPTION OF THE DRAWING

Figure 1:
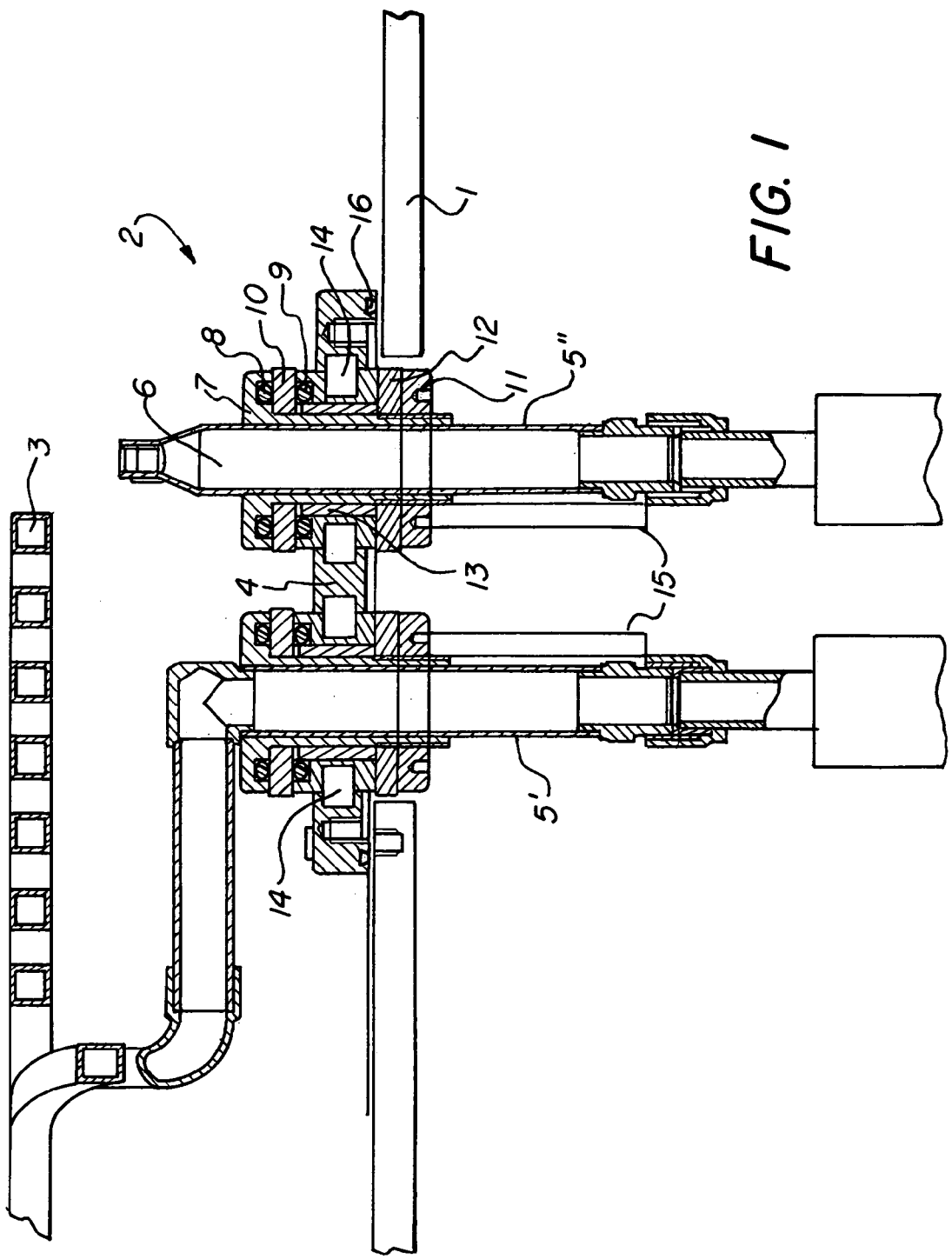
FIG. 1 shows a cross-section through part of a reaction chamber according to the invention.

FIG. 1 shows a cross-section through part of a reaction chamber according to the invention, of which only an outside wall 1 is represented. Provided in the outside wall 1 is an opening (without reference numeral), into which the HF feedthrough designed according to the invention is inserted. The HF feedthrough is connected to an induction coil 3 in the interior space 2 of the reaction chamber. It goes without saying that the feedthrough according to the invention may also supply other elements disposed in the reaction chamber with electric power.

The feedthrough according to the invention has a support plate 4, which consists for example of stainless steel and in the exemplary embodiment shown has two openings for HF lines 5' and 5", which are connected to the induction coil 3. The HF lines 5 consist of copper and have in their interior a channel 6 through which water flows. Provided on each of the lines 5 is a sleeve 7 with a collar at the end disposed in the interior space 2 of the reaction chamber and with an external thread on the end located outside the reaction chamber. Provided on the underside of the collar of the sleeve 7 is a groove, into which an O-ring 8 is inserted. A groove into which a O-ring 9 is inserted is also provided on the upper side of the support plate 4. Disposed between the collar 7 and the support plate 4 is a disk 10 of an insulating material, preferably quartz or a ceramic material.

To hold the seals 8 and 9 in a sealing manner against the disk 10, screwed onto the external thread on the other end of the sleeve 7 is a union nut 11, which is electrically separated from the support plate 4 by a disk 12 of an insulating material, for example likewise quartz or a ceramic material. To avoid arc-overs between the sleeve 7 and the support plate 4, a sleeve 13 which likewise consists of an insulating material, preferably a plastics material, or polymer such as polytetrafluoroethylene (TEFLON) is inserted in the intermediate space.

For cooling the support plate 4, channels 14 through which water is conducted via connections 15 are provided in said support plate.

On the side of the support plate 4 facing the outside wall 1, a groove in which an O-ring 16 is inserted in the outer edge region. The support plate 4 is pressed in a sealing manner against the wall 1 by a screwed connection indicated in the drawing.

The drawing also shows securing screws and a connection for a water supply and discharge. This connection may be realized for example by means of a screwed pipe connection.

The invention has been described above on the basis of an exemplary embodiment without restricting generality. In particular, the geometrical realization represented is to be understood merely as an example.

What is claimed is:

1. A reaction chamber for carrying out substrate coating methods having at least one opening in which a high frequency (HF) feedthrough is inserted in a pressure and vacuum tight manner in at least one outside wall, comprising:

a support plate comprising at least one channel for liquid coolant, the support plate positioned around the at least one opening, the support plate further comprising at least one support plate opening for an HF line, the HF line consisting of copper, the HF line has at its region disposed in the reaction chamber a collar on which a first seal is provided, a first disk of an insulating material is inserted between a second seal on the support plate and the first seal on the collar, at the region of the HF line disposed outside the reaction chamber there is provided a thread onto which a metal screw element is screwed in such a way that it holds the collar of the HF line in a sealing manner against the first insulating disk via the first seal and said first insulating disk against the support plate via the second seal, without an electrical contact between the HF line and the support plate being established or an arc-over between the HF line and the support plate occurring, a second disk of an insulating material inserted between the screw element and the support plate, and a first sleeve of insulating plastic or polytetrafluoroethylene which prevents electrical contact or arc-over between the HF line and the support plate positioned between the first disk and the second disk or the screw element, wherein the collar is a component of a second sleeve which is mounted in a sealing manner on the HF line, the collar or the second sleeve comprising a metallic material soldered onto the HF line.

2. The reaction chamber as claimed in claim 1, characterized in that the screw element is a union nut.

3. The reaction chamber as claimed in claim 2, characterized in that the support plate is water-cooled.

4. The reaction chamber as claimed in claim 3, characterized in that the first and the second disk consist of quartz or a ceramic material.

5. The reaction chamber as claimed in claim 1, characterized in that the support plate has a seal lying externally on its circumference, and is screwed to the wall of the reaction chamber in the region inside the seal.

6. The reaction chamber as claimed in claim 5, characterized in that the seals are O-rings.

7. The reaction chamber as claimed in claim 6, characterized in that at least two HF lines are provided in the support plate.

8. The reaction chamber as claimed in claim 7, characterized in that the two HF lines are the leads for a coil of an inductive heater.

9. The reaction chamber as claimed in claim 1, characterized in that every HF line is surrounded by a channel through which water flows.

\* \* \* \* \*